United States Patent
Kostelnik et al.

(10) Patent No.: US 9,899,137 B2
(45) Date of Patent: Feb. 20, 2018

(54) METHOD FOR PRODUCING A COIL INTEGRATED IN A SUBSTRATE OR APPLIED TO A SUBSTRATE, AND ELECTRONIC DEVICE

(71) Applicants: Jan Kostelnik, Kichberg (DE); Alina Schreivogel, Rot am See (DE); Albert Kiessling, Weil der Stadt (DE); Metin Giousouf, Esslingen (DE)

(72) Inventors: Jan Kostelnik, Kichberg (DE); Alina Schreivogel, Rot am See (DE); Albert Kiessling, Weil der Stadt (DE); Metin Giousouf, Esslingen (DE)

(73) Assignee: Würth Elektronik GmbH & Co. KG, Niedernhall (DE)

( * ) Notice: Subject to any disclaimer, the term of this patent is extended or adjusted under 35 U.S.C. 154(b) by 106 days.

(21) Appl. No.: 14/426,962

(22) PCT Filed: Sep. 12, 2013

(86) PCT No.: PCT/EP2013/068885
§ 371 (c)(1),
(2) Date: Mar. 9, 2015

(87) PCT Pub. No.: WO2014/041057
PCT Pub. Date: Mar. 20, 2014

(65) Prior Publication Data
US 2015/0348695 A1    Dec. 3, 2015

(30) Foreign Application Priority Data
Sep. 12, 2012    (DE) .................. 10 2012 216 101

(51) Int. Cl.
*H01F 7/06*    (2006.01)
*H01F 27/28*    (2006.01)
(Continued)

(52) U.S. Cl.
CPC ..... *H01F 27/2804* (2013.01); *H01F 17/0006* (2013.01); *H01F 27/2823* (2013.01);
(Continued)

(58) Field of Classification Search
CPC ............. H01F 17/0006; H01F 27/2804; H01F 27/2823; H01F 27/324; H01F 41/06;
(Continued)

(56) References Cited

U.S. PATENT DOCUMENTS 5,067,230 A * 11/1991 Meunier ............... G11B 5/1272
                                                             29/603.13
5,281,305 A * 1/1994 Lee ..................... G02B 6/12002
                                                             216/24
(Continued)

FOREIGN PATENT DOCUMENTS

DE        19723068        5/1999

OTHER PUBLICATIONS

International Search Report, PCT/EP2013/068885, dated Dec. 16, 2013.
(Continued)

*Primary Examiner* — Paul D Kim
(74) *Attorney, Agent, or Firm* — Cesari & Reed, LLP; R. Michael Reed

(57) ABSTRACT

The subject matter of the invention relates to a method of producing a coil integrated in a substrate, using the following steps: creating the cavity in a substrate, said cavity having an open end which interrupts a surface of the substrate, introducing a paste containing ferromagnetic particles into the cavity so as to produce a coil core, closing the cavity by applying a cover layer so as to bridge the interruption in the surface of the substrate, introducing first winding portions of the coil which are vertical with respect to the surface, with a plurality or all of the first winding
(Continued)

Figure 1:
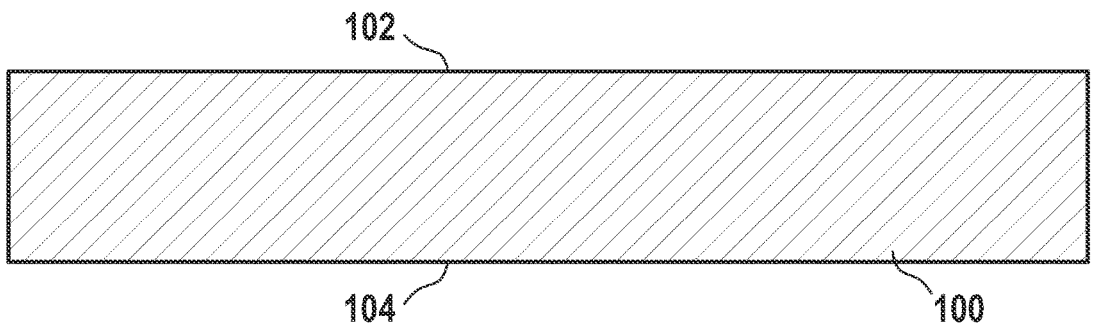

portions passing through the coil core contained inside the cavity, and applying second winding portions of the coil onto the surfaces of the substrate, with the second winding portions contacting the first winding portions so as to create the windings of the coil.

23 Claims, 9 Drawing Sheets

(51) Int. Cl.
| | |
|---|---|
| *H01F 27/32* | (2006.01) |
| *H01F 41/06* | (2016.01) |
| *H05K 1/16* | (2006.01) |
| *H01F 17/00* | (2006.01) |
| *H01F 41/04* | (2006.01) |
| *H01F 27/40* | (2006.01) |
| *H03K 17/95* | (2006.01) |
| *H05K 3/46* | (2006.01) |

(52) U.S. Cl.
CPC ......... *H01F 27/324* (2013.01); *H01F 41/046* (2013.01); *H01F 41/06* (2013.01); *H05K 1/165* (2013.01); *H01F 2017/002* (2013.01); *H01F 2017/0066* (2013.01); *H01F 2027/406* (2013.01); *H03K 17/9505* (2013.01); *H05K 3/4623* (2013.01); *H05K 2201/086* (2013.01); *H05K 2201/09036* (2013.01); *H05K 2203/061* (2013.01); *Y10T 29/49073* (2015.01)

(58) Field of Classification Search
CPC .. H01F 41/046; H03K 17/9505; H05K 1/165; H05K 3/4623
See application file for complete search history.

(56) References Cited

U.S. PATENT DOCUMENTS

| | | | |
|---|---|---|---|
| 6,013,939 A | 1/2000 | El-Sharawy et al. | |
| 7,068,870 B2* | 6/2006 | Steinberg | G02B 6/10 385/132 |
| 7,477,128 B2* | 1/2009 | Quilici | H01F 17/0033 336/200 |
| 8,169,285 B2* | 5/2012 | Hoglauer | H01F 17/0006 257/657 |
| 2003/0123833 A1* | 7/2003 | Ricks | G02B 6/30 385/137 |
| 2005/0122199 A1* | 6/2005 | Ahn | H01F 17/0033 336/200 |
| 2006/0145805 A1 | 7/2006 | Kim et al. | |
| 2010/0001826 A1 | 1/2010 | Gardner et al. | |

OTHER PUBLICATIONS

PCT/EP2013/068885, Transmittal of Translation, Mar. 26, 2015, 1 page.
PCT/EP2013/068885, Written Opinion, dated Mar. 17, 2015, 8 pages.
PCT/EP2013/068885, Written Opinion in German, dated Mar. 17, 2015, 7 pages.

\* cited by examiner

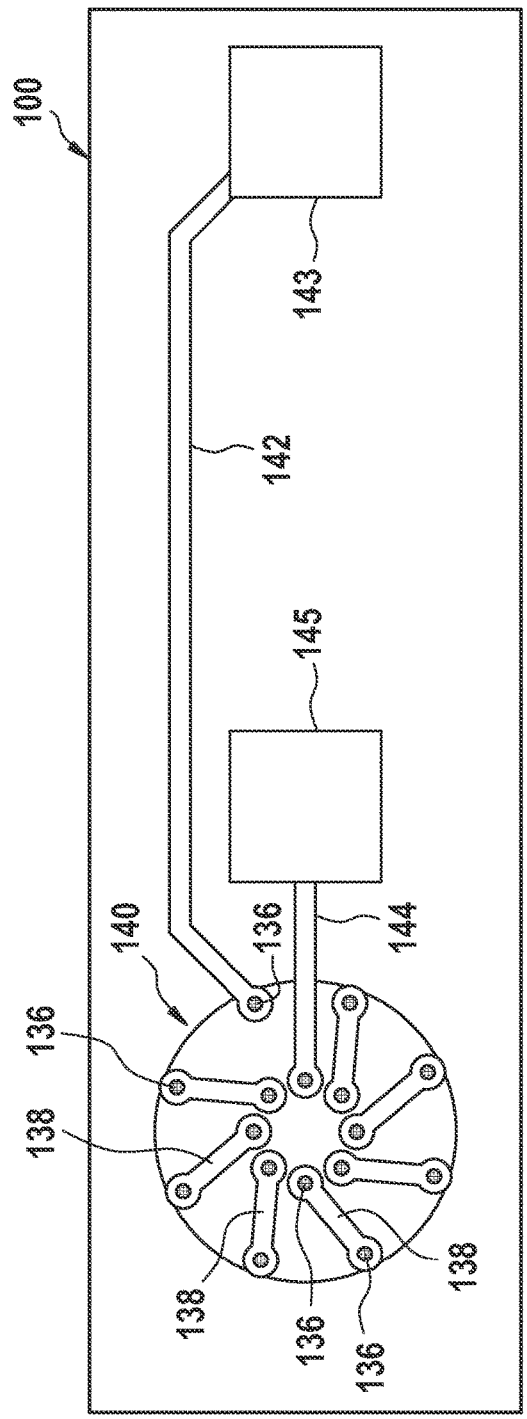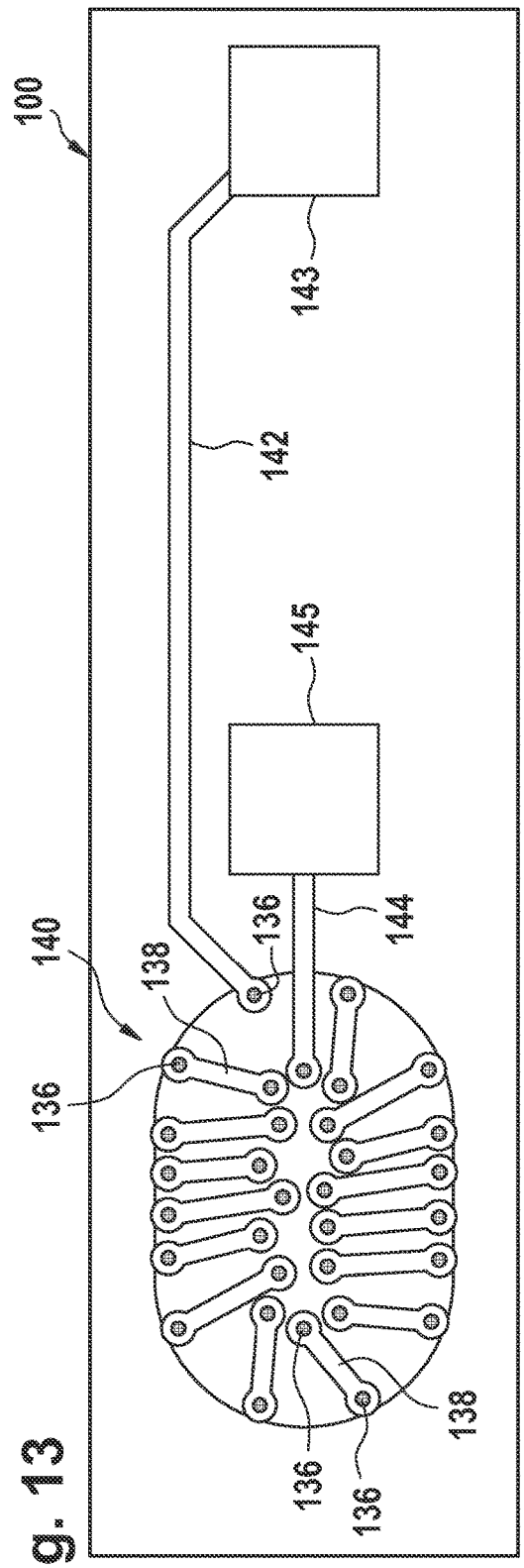

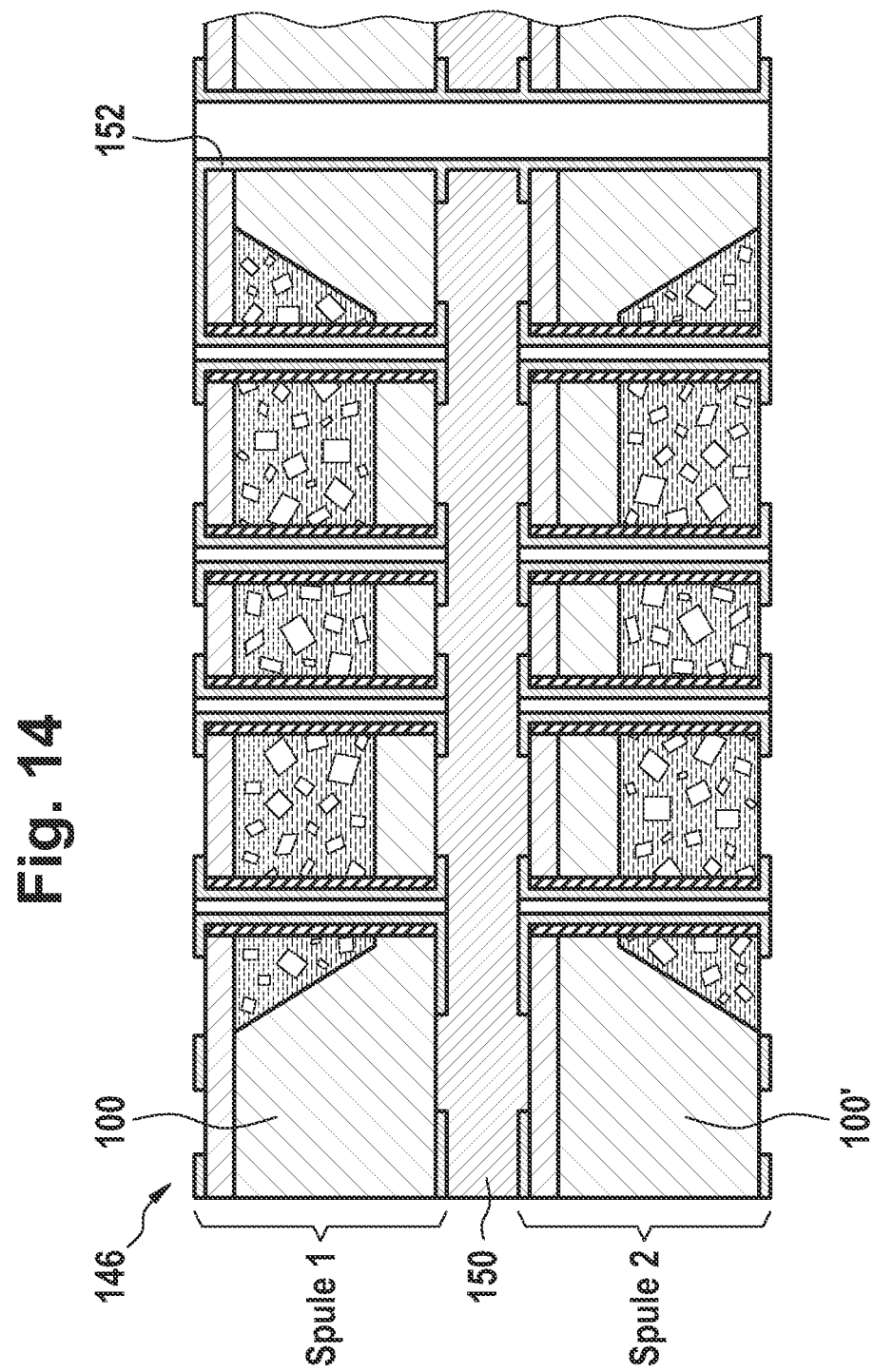

METHOD FOR PRODUCING A COIL INTEGRATED IN A SUBSTRATE OR APPLIED TO A SUBSTRATE, AND ELECTRONIC DEVICE

The subject matter of the present invention relates to a method of producing a coil which is integrated in a substrate or applied onto a substrate, in particular for the purpose of producing a printed circuit board, and to an electronic device having at least one coil.

Known from the prior art are planar coils having coil windings which are applied onto the surface of a substrate. The inductance that can be cost-effectively generated with such planar coils is only relatively low, with the planar coils moreover taking up a relatively large amount of space on the surface of the substrate.

From www.elektroniknet.de of Apr. 26, 2012, "Embedding active and passive components in the printed circuit board," embedded planar coils in folded flexible technology are known. The flexible film or foil structures are folded, thus making it possible to produce coils of any size having a nearly unlimited number of layers. This is especially useful for sensor applications.

DE 43 06 416 A1 discloses a coil structure for a printed circuit board layout. A winding of the coil is formed by plated drill holes and conductor track sections. A ferrite core can be inserted into a slot on the side of the printed circuit board. As an alternative, the inner layers of the printed circuit board can be used as a support for the printed core structures. The disadvantage of this coil structure is that it is not suitable for miniaturization, on the one hand, and that it is not possible to generate high inductances, on the other hand.

DE 103 54 694 A1 discloses an inductive sensor with a coil for generating a magnetic field. The coil is formed by two layers, between which a strip of an amorphous metal serves as the core of the coil. The coil windings are formed by conductor track sections and plated through-holes which are disposed on the layers and which rung past the core of the coil.

DE 103 55 003 A1 discloses an inductive sensor having a coil which generates a magnetic field, with the core of the coil being disposed in a cut-out of the circuit support.

US 2011/0108317 A1 discloses a packaged structure having a magnetic component and a method of manufacturing such a structure. The packaged structure includes an insulating substrate having a ring-type recess, an island portion and a surrounding portion defined by the ring-type recess, with the ring-type recess being positioned laterally between the island portion and the surrounding portion. In addition, the packaged structure also includes a ring-type magnetic component which is placed in the ring-type recess; an upper wiring layer above the insulating substrate and a lower wiring layer under the insulating substrate; an inner plated through-hole which passes vertically through the island portion and which connects the upper wiring layer and the lower wiring layer; an outer plated through-hole which passes vertically through the surrounding portion and which connects the upper wiring layer and the lower wiring layer, with the inner plated through-hole, the outer plated through-hole, the upper wiring layer and the lower wiring layer forming a coil of wire which surrounds the ring-type magnetic component.

DE 10 2007 024 908 A1 discloses a tunable inductive component having at least one ceramic multilayer body with at least one ferrite layer with ferritic material and at least one coil that is integrated in the volume of the multilayer body. The permeability of the ferrite layer is dependent on a mechanical stress acting on the ferrite layer, with the coil being integrated in the volume of the multilayer body in such a manner that the inductance of the coil is dependent on the permeability of the ferrite layer, and with a means for transferring the mechanical stress onto the ferrite layer being provided, thus allowing the permeability of the ferrite layer to be adjusted.

Document DE 101 96 259 T1 relates to the arrangement of a filling material in the passages of an electronic substrate, e.g., by means of placing an electrically conductive, thermally conductive or non-conductive paste in and on electronic boards, ceramic substrates and "packages."

According to US 2003/0057544 A1, a monolithic integrated structure including one or more packaged components such as integrated circuits, discrete components, LEDs, photo couplers and the like is formed by placing electrically conductive lands on one surface of each packaged component, and then placing one or more packaged components into a substrate in such a manner that the surface of each packaged component containing the electrically conductive lands is visible and substantially coplanar with the top surface of the substrate.

In addition, DE 689 23 717 T2 discloses a composite substrate with a low dielectric constant.

None of the aforementioned documents, however, discloses a method by means of which a coil that is integrated in a substrate can be produced, wherein the coil is completely surrounded by the core material. However, this offers advantages over the coil structures known from the prior art with respect to the stray fields of a coil structure and with respect to the homogeneity of the magnetic field outside the coil. This will be described in detail below.

Thus, the present invention has the objective of creating an improved method of producing a coil that is integrated in a substrate or applied onto a substrate, in particular of producing a printed circuit board as well as an electronic device comprising such a coil.

The objective forming the basis of the invention is solved by the features of the independent claims. Embodiments of the invention are provided in the dependent claims.

According to embodiments of the invention, the following method is used to produce a coil:

First, a cavity is created in the substrate which, for example, is open toward the front face of the substrate. The substrate can be a flat material, such as is usually used to produce printed circuit boards, for example, a fiber-reinforced plastic, a plastic film or foil or another electrically insulating material.

The cavity can be created in the substrate by means of a technique that removes material from the substrate, for example, by removing the material by means of a laser, by punching or by a metal-cutting process, preferably by milling and by hot stamping.

After the cavity has been produced in the substrate, said cavity is filled with a paste containing ferromagnetic particles. Paste is here defined as a mixture of the particles and a liquid, for example, a solvent, for example, a suspension. The paste that has been introduced forms a core material in the cavity which serves to produce a coil core.

According to one embodiment of the present invention, after the paste has been introduced, the cavity is closed by applying a cover layer so as to bridge the interruption of the surface of the substrate. However, applying a cover layer is optional: Instead of applying the second winding portions onto the cover layer, they can also be applied onto the surface of the core material, e.g., by means of printing. Thus, the second winding portions can be applied onto the surface of the substrate, for example, by applying the second winding portions onto the cover layer which closes the cavity or directly to the surface of the core material which also closes the top of the cavity.

The cover layer can be a so-called prepreg, i.e., an uncured thermosetting plastic matrix into which fibers are embedded. Such a prepreg can be applied onto the substrate by means of hot pressing, thereby closing the cavity. This also allows the cover layer to smooth out any potential unevenness that remains, after the cavity has been filled, between the surface of the substrate and the surface of the paste on the open end of the cavity, thus ensuring that the cover layer that now forms the surface of the substrate is smooth.

In particular, the cover layer can be a fiberglass mat which is impregnated with epoxy resin (e.g., FR-4 materials) and which is applied onto the cavity that is filled with the core material, or another layer of material, e.g., a plastic layer, which is applied by means of laminating it on.

The windings of the coil are subsequently produced as follows: Initially, first winding portions are introduced into the substrate, said winding portions being positioned perpendicularly to the surface of the substrate. For example, the first winding portions can be formed by so-called VIAs (Vertical Interconnect Access). These VIAs extend between the front face and the back face of the substrate and/or connect two different substrates of a multilayer printed circuit board (multilayer PCB).

The second winding portions of the coil are applied onto the front face and the back face of the substrate, with the second winding portions electrically contacting the ends of two of the first winding portions.

In this manner, different coil geometries can be implemented, for example, a cylindrical coil, the coil axis of which extends parallel to the surface of the substrate, or a ring-type or toroidal coil which is oriented parallel to the surface of the substrate.

Embodiments of the invention are especially useful since a plurality or all of the first winding portions pass through the core of the coil located inside the cavity, which allows the coil to be miniaturized while at the same time having a relatively large number of windings. A special advantage is obtained when all of the first winding portions pass through the core of the coil contained in the cavity. In addition to the thus possible miniaturization and at the same time relatively high inductance, this also entails advantages in terms of process engineering since it allows all of the first winding portions to be processed uniformly in one process.

An especially useful advantage is that the stray magnetic field of a conductor that passes through the core of the coil is reduced. A special advantage is obtained when all of the first winding portions pass through the core of the coil since in this case, the lateral stray field of the coil is considerably reduced and the external magnetic field that is produced by the coil is concentrated on the end faces of the coil. Another advantage is that the homogeneity of the magnetic field which is generated on the end faces in the external region of the coil is improved.

This is of special advantage to inductive sensors, in particular inductive proximity sensors. In addition thereto, a special advantage is that the coils according to the present invention entail a higher load capacity and improved reliability since the air gap usually present in inductive sensors can be omitted. The disadvantage of such an air gap is that its dimensions can vary on account of temperature fluctuations or mechanical loads.

A very special advantage is furthermore that the miniaturization of the coil is not limited by the size or manufacturing tolerances of the cavity since all of the first winding portions preferably pass through the cavity and thus through the core material so that the core material which is surrounded by the first winding portions forms the core of the coil. The invention rejects the paradigm that the core material must be located completely inside the coil. On the contrary, the invention even allows a plurality of coils to be disposed side by side in a single cavity since all coil windings, i.e., the first winding portions, can pass through the core material contained in the cavity.

According to an embodiment of the present invention, the core of the coil in the cavity is designed to have a ring-type, toroidal or disk-type shape, while the core of the coil can have a round or angular shape.

According to an embodiment of the present invention, the cavity has a bottom surface parallel to the surface of the substrate. Projecting from the bottom surface are lateral flanks that form the opening of the cavity. The lateral flanks preferably form a right angle or an acute angle with the surface of the substrate, for example, an angle between 30° and 60°, preferably an angle of 45°.

Such an angle has the surprising advantage that air inclusions are avoided when the paste is introduced into the cavity since during the process of introducing the paste, the air can escape along the lateral flanks. This is especially advantageous when the paste is printed into the cavity, for example, by means of screen printing, gravure printing, pad printing, or with the aid of a dispenser. Surprisingly, it proved to be especially advantageous to introduce the paste by means of screen printing, and the lateral flanks of the cavity enclose an angle of approximately 45° with the surface.

According to an embodiment of the present invention, the particles consist of a soft magnetic amorphous and/or nanocrystalline alloy.

Especially advantageous are particles which have a nanocrystalline structure since this leads to a very high permeability while having a small coercive field strength. Additional advantages of such nanocrystalline materials are outstanding magnetic values, cost-effective alloy compositions, excellent good temperature stability and very favorable frequency properties. The nanocrystalline particles can be formed from a soft magnetic metal alloy, for example, based on Fe, Si and/or B with additions of Nb and/or Cu.

According to an embodiment of the present invention, the core material which is introduced by introducing the paste into the cavity is electrically conductive. To electrically insulate the first winding portions against the core material, the following method can be used: First, a through-hole is drilled through the substrate so as to produce a VIA, with the through-hole passing through the core material.

This through-hole is subsequently filled with an electrically insulating material, for example, with a resin. Subsequently, a through-hole is drilled through this electrically insulating material so that a layer of the electrically insulating material remains. Next, an electrically conductive material is applied on top of said material, for example, by means of plating, so as to produce the VIA for the formation of one of the first winding portions.

According to embodiments of the present invention, structuring techniques, for example, etching techniques, are used to apply the second winding portions on the surface of the substrate, i.e., on the front and back faces of the substrate.

According to embodiments of the present invention, the paste, after having been introduced into the cavity, is compacted by applying contact pressure on the paste and/or by exposing it to an increased temperature of, for example 70° C. to 80° C. In this manner, the liquid portion of the paste is reduced, which leads to a reduction of the volume.

This is of special advantage when the viscosity of the paste must first be such that the paste can be applied by a printing technique, for example, by screen printing. To allow the paste to be applied by means of a printing method, the viscosity of the paste should not be too high in order to ensure that the paste is sufficiently flowable. After the paste has been introduced into the cavity, it is desirable that the liquid portion on the other side be as low as possible in order to compact the particles so that the inductance of the resulting coil is as high as possible. This can also be achieved by reducing the liquid portion of the paste after it has been introduced into the cavity.

According to an embodiment of the present invention, the volume that was vacated in the cavity by the compaction is filled by again introducing paste, for example, using an additional screen printing procedure. This can further increase the inductance of the resulting coil since the volume of the cavity is fully utilized in spite of the preceding compaction.

According to an embodiment of the present invention, the following method is used to compact the particles in the cavity:

First, a separating layer is applied onto the open end of the cavity. The separating layer is permeable for the liquid portion of the paste, in particular when said liquid portion is converted into its gaseous phase as a result of the temperature increase. The separating layer can, for example, be a perforated plastic film or foil.

A receiving layer is applied on top of the separating layer and is designed to receive the liquid portion of the paste that passes through the separating layer. For example, the receiving layer can be a nonwoven material.

When the liquid portion of the paste is reduced in the cavity by exposing the paste in the cavity to contact pressure and/or by increasing the temperature, this portion, in its liquid or gaseous phase, passes through the separating layer, for example, through the perforations of the separating layer, and thus reaches the receiving layer where this portion is absorbed. The separating layer at the same time prevents components, e.g., fibers, of the receiving layer from adhering to the paste.

Subsequently, the separating layer and the receiving layer are removed, and the cavities are closed by the cover layer. Optionally, prior thereto, the volume vacated as a result of the reduction of the liquid portion can be filled by again introducing paste.

According to an embodiment of the present invention, in this manner, a plurality of the integrated coils are formed in the substrate. These coils can be connected to form, for example, a sensor array in order to produce, for example, a highly sensitive inductive position sensor.

According to another embodiment of the present invention, the second winding portions can be printed. The second winding portions can be printed, for example, by means of conductive ink; additional circuit components, which may be formed by means of an electrically conductive polymer, may likewise be printed onto the substrate in order to connect these to the coil or coils.

According to another embodiment of the present invention, the cavity can be produced by means of a hot stamping technique.

According to an embodiment of the present invention, a "cavity" is here defined as a recess in the substrate, a cut-out through the substrate or even a cut-out through two or more substrates of a multilayer PCB that are disposed one on top of the other.

Producing the cavity in the form of a cut-out can have advantages when filling the cavity with core material: When a pasty or liquid base material, by means of which the core material is to be formed, is used, air inclusions or gas inclusion in the core material can be avoided since air and solvent can escape from both ends of the cavity.

According to an embodiment of the present invention, after the paste has been introduced into the cavity, it is subjected to a drying process during which the paste is cured; for example, in the course of the drying process, solvent escapes from the paste. During the drying process, the paste is set into vibration, e.g., by means of a vibrating table, onto which the substrate is affixed, or by means of an ultrasound transmitter, in order to ensure that the paste is thoroughly mixed during the drying process and thus to counteract the formation of a plug on the open end or ends of the cavity during the drying process. Preventing the formation of a plug ensures that all of the solvent escapes and that drying takes place quickly. After the paste is cured, e.g., the holes are drilled for the purpose of introducing the first winding portions.

As an alternative to a pasty or liquid base material, films or foils can be used as the core material, in particular multiple layers of films or foils, in particular films or foils made from magnetic nanocrystalline alloys based on Fe, Si and B with Nb and Cu additives, such as are available under the trade name Vitroperm from the Vacuumschmelze company.

According to an embodiment of the present invention, the core of the coil is first produced separately as a solid and subsequently affixed in the cavity, for example, so as to be keyed and/or friction-locked, e.g., by pressing it into the cavity.

The coil cores can be produced, for example, by extruding a polymer ferrite composite material. For example, by means of the extrusion process, continuous profiles are produced from the polymer ferrite composite material, from which profile individual coil cores are obtained by cutting the extruded profile into sections.

Such an extrudate can also be produced in the form of a flexible band and can be applied onto the substrate by means of an adhesive, i.e., especially in a place where a higher overall thickness can be tolerated. Thus, in this case, the coil core may extend beyond the surface of the substrate, with mixed forms being possible as well, for example, filling the cavity in the substrate with a pasty or liquid material and subsequently, after curing, applying one or a plurality of material layers thereof or of another core material onto the already filled cavity. Such an additional film or foil could also be glued to one side of a printed circuit board, in particular a multilayer PCB, which is especially useful when the sensor is to be disposed on the end face.

According to an embodiment of the invention, the cross section of a cavity or of the coil core can have various geometric shapes which can be symmetrical or asymmetrical. The shape of the cavity and thus the shape of the coil core can be such that the magnetic field has a geometry and strength that is optimized for a specific application.

Besides being rectangular, the coil core can, for example, have a triangular, round or convex shape. Such geometric shapes of the cavity can be produced, for example, by milling out or by water jet cutting, and the cavity can be filled with the core material, for example, by printing, in particular by inkjet printing.

In addition, it is also possible for the core material within the coil core to be varied locally in order to obtain a desired shape of the magnetic field, with such a local variation of the material composition in the coil core being achieved, for example, by printing different core materials in layers.

According to an embodiment of the invention, the cavity extends over a plurality of substrate layers in the vertical direction, with the VIAs, i.e., the plated through-holes, being produced, for example, by drilling, laser cutting, a plasma treatment or water jet cutting. Combinations of such techniques are also possible, for example, water jet cutting with laser guidance.

Embodiments of the invention make it possible to produce miniaturized coils by means of cost-effective high-throughput structuring and production techniques, such as are suitable for mass production.

According to an embodiment of the invention, the coil is not, or not completely, integrated in the substrate but projects beyond the surface of the substrate. To produce such a coil, for example, the following steps are taken:

First, second winding portions of the coil are applied onto the surface of the substrate, for example, by printing or structuring techniques.

In the region of the surface in which the second winding portions are located, the core material is applied onto the substrate in such a manner that it covers the second winding portions.

The first winding portion are subsequently introduced into the core material, for which purpose holes are, for example, drilled into the core material, which holes are subsequently plated.

Subsequently, additional second winding portions are applied onto the surface of the core material, for example, by printing, in particular by three-dimensional printing, such as aerosol printing or inkjet printing, so as to bring the various winding portions into electrical contact with one another and to form the coil windings.

In another aspect, the present invention relates to a method of producing a multilayer printed circuit board. One or a plurality of the coils are integrated in various layers of the printed circuit board, and these coils are connected to each other via the circuit board. In addition, other electrical or electronic components can be mounted on the circuit board so as to create an electronic device.

In another aspect, the present invention relates to an electronic device comprising at least one coil which is integrated into a substrate, said substrate having a closed cavity holding ferromagnetic particles which form the core of the coil, with the windings of the coil being formed by first winding portions and by second winding portions, with several or all of the first winding portions passing through the cavity, and with the second winding portions electrically contacting the second winding portions.

According to an embodiment of the electronic device, the first winding portions are formed by VIAs which have an electrically insulating inner coating so as to create an electrical insulation against the particles of the core material.

According to another embodiment, the electronic device is a sensor, in particular a pressure sensor, a force sensor, an acceleration sensor, a position sensor or a magnetic field sensor and/or an electromagnetic actuator.

Embodiments of the invention will be explained in greater detail below with reference to the drawings.

Figure 10:
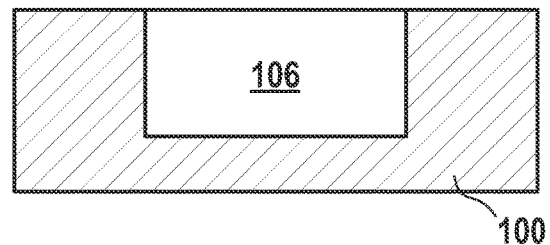
Figure 11:
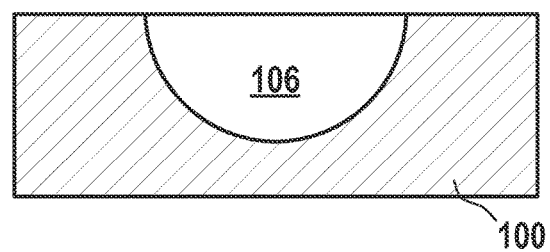
Figure 15:
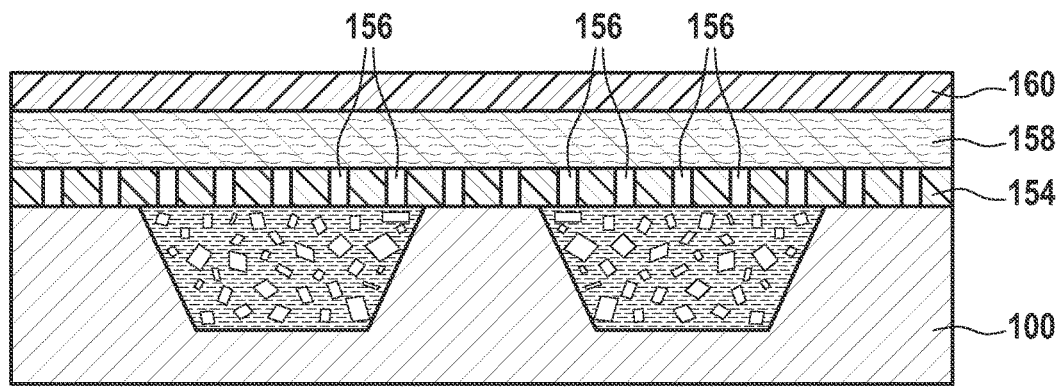
Figure 16:
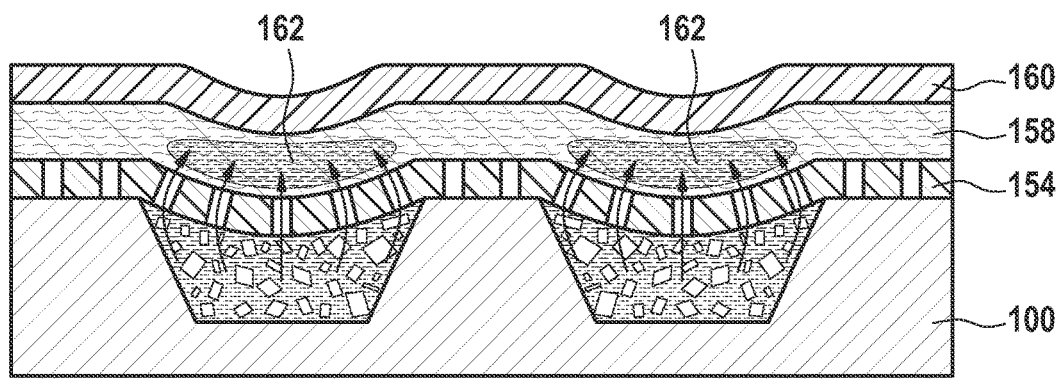
Figure 17:
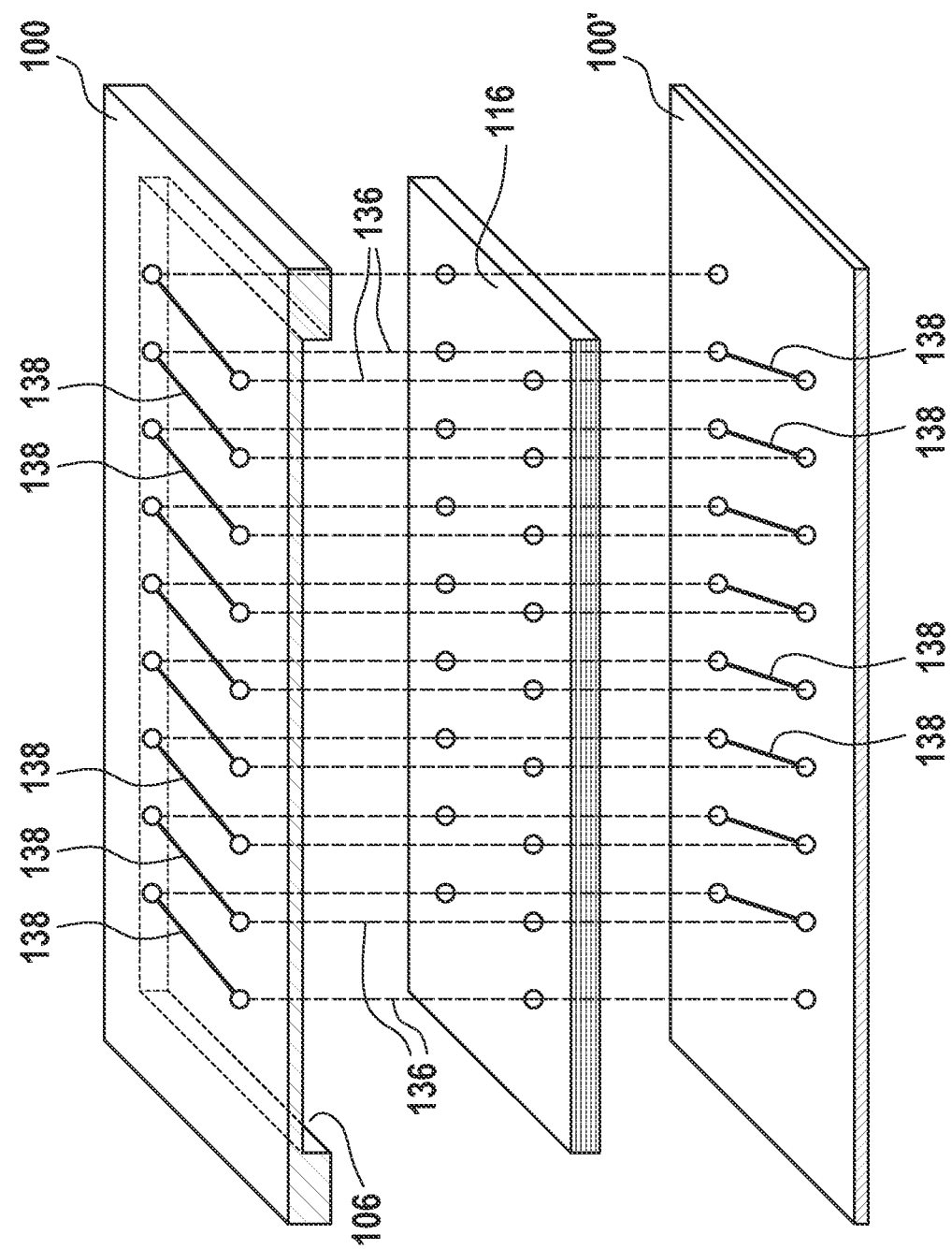
Figure 18:
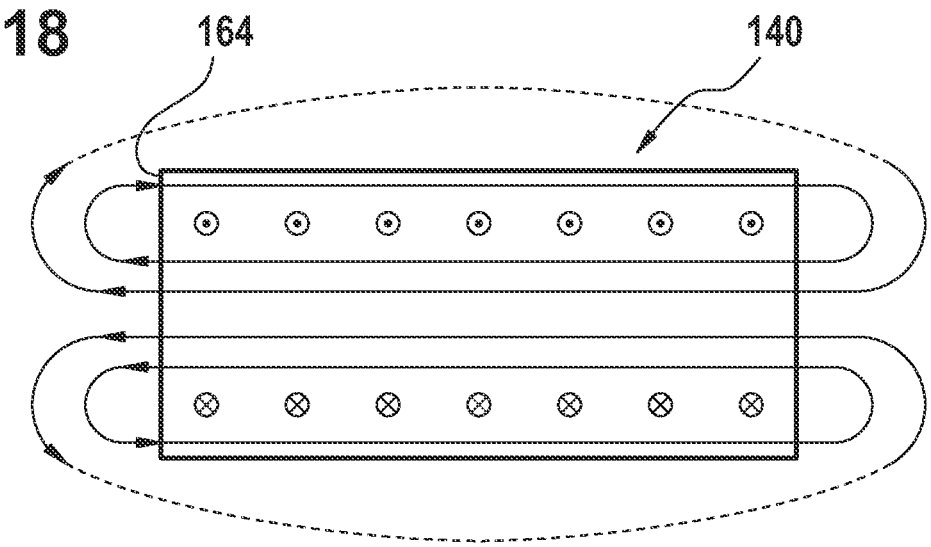
Figure 19:
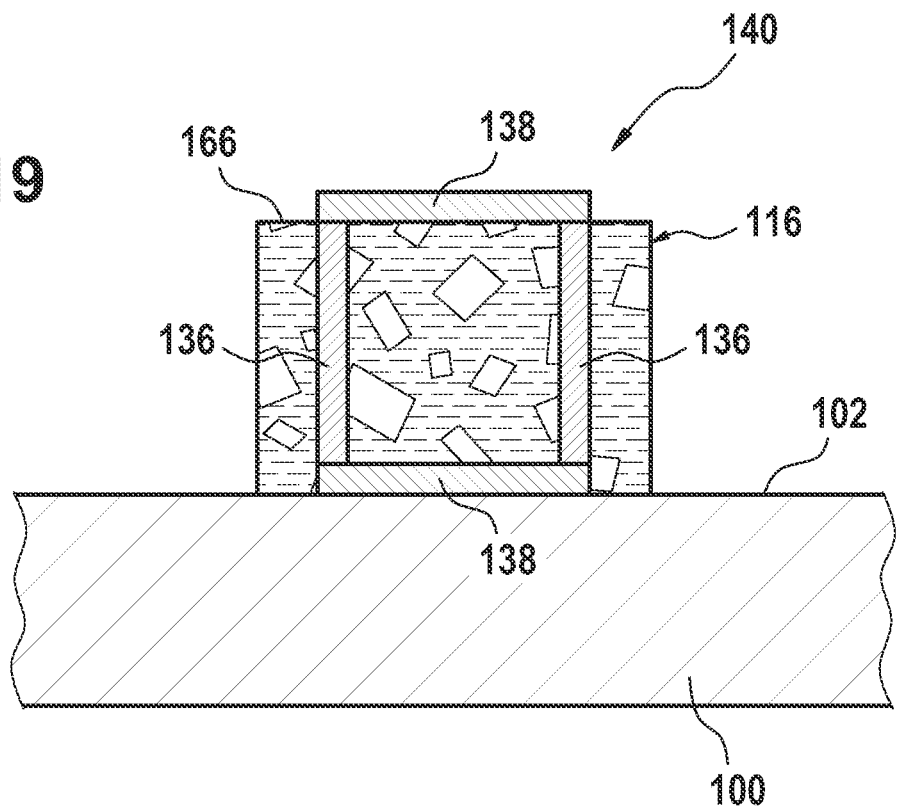
Figure 20:
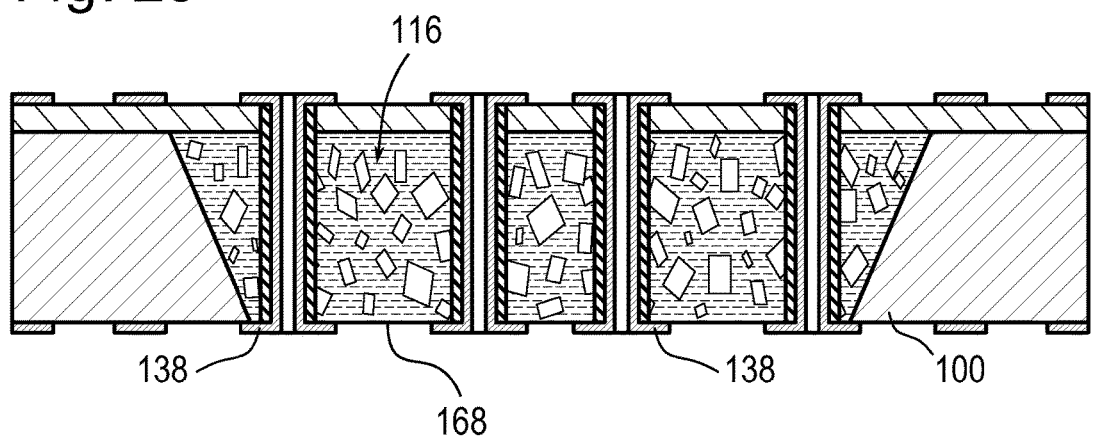

As can be seen:

FIG. 1 to FIG. 9 show various steps of an embodiment of a method of producing a coil integrated in a substrate according to the present invention, FIG. 10 shows a cross section of an embodiment of the cavity with vertical flanks, FIG. 11 shows a cross section of an embodiment of the cavity with a semicircular profile, FIG. 12 shows a top view of a printed circuit board with an integrated ring-type coil according to the present invention, FIG. 13 shows a top view of a printed circuit board with an integrated oval coil, FIG. 14 shows an embodiment of a printed circuit board with two series-connected coils, FIG. 15 and FIG. 16 show method steps for compacting the paste in the cavity, FIG. 17 shows an exploded view of an embodiment of a two-layer PCB, FIG. 18 shows a top view of the field pattern of the coil that is integrated into the two-layer PCB of FIG. 17, FIG. 19 shows a cross section through a coil according to another embodiment of the present invention, which coil has been applied onto the surface of the substrate, FIG. 20 shows an embodiment of the cavity in the form of a cut-out.

Identical or equivalent elements of the following embodiments will be identified by identical reference characters.

FIG. 1 shows the cross section through a substrate 100. The substrate 100 may, for example, be a not yet populated circuit board, such as is used for the production of printed circuit cards, printed circuit boards or printed circuits. The substrate 100 is flat and has a surface 102 on its front face and a surface 104 on its back face.

In a first method step, a cavity 106 is created in the substrate. The cavity has an open upper end 108 which interrupts the surface 102 of the substrate 100.

The cavity 106 has a bottom surface 110 which runs essentially parallel to the surfaces 102 and 104. The bottom surface 110 is adjoined by flanks 112 and 114, each extending from the bottom surface 110 to the surface 102, as a result of which the open end 108 is formed.

The flanks 112 and 114 form an angle $\alpha$ with the surface 102. The angle $\alpha$ is an acute angle within the range of $0<\alpha 90°$. The angle $\alpha$ preferably measures between 30° and 60°, especially approximately 45°. Using this angle $\alpha$ is especially useful if the paste is introduced into the cavity 106 by means of a screen printing technique since it ensures that the formation of air inclusion in the paste is very effectively avoided.

Figure 3:
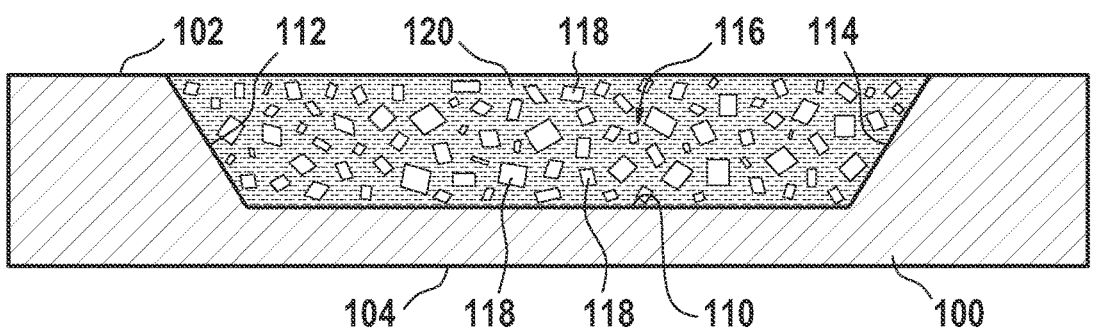

FIG. 3 shows the substrate 100 after a paste has been introduced into the cavity. The paste can be a mixture of a solid and a liquid, especially a suspension, in which particles 118 are surrounded by a liquid 120.

The paste can be introduced into the cavity 106 by means of a dispenser or a printing technique, for example, by means of screen printing, gravure printing, pad printing or the like.

The viscosity paste [sic; the viscosity of the paste] must be adjusted to the method used; for example, when introducing the paste into the cavity 106 by means of the screen printing technique, the viscosity of the paste should not be too high since this technique requires the paste to have a certain degree of flowability. By introducing the paste, the core material 116 is introduced into the cavity 106, by means of which one or a plurality of coils can be produced.

The cavity 106 can be created by means of a laser, an etching technique or by mechanical means, in particular by milling. In this particular embodiment, by introducing the paste into the cavity, said cavity assumes the shape of a disk. As an alternative, the cavity 106 can also have a different profile so as to receive a ring-type or toroidal coil core.

Figure 4:
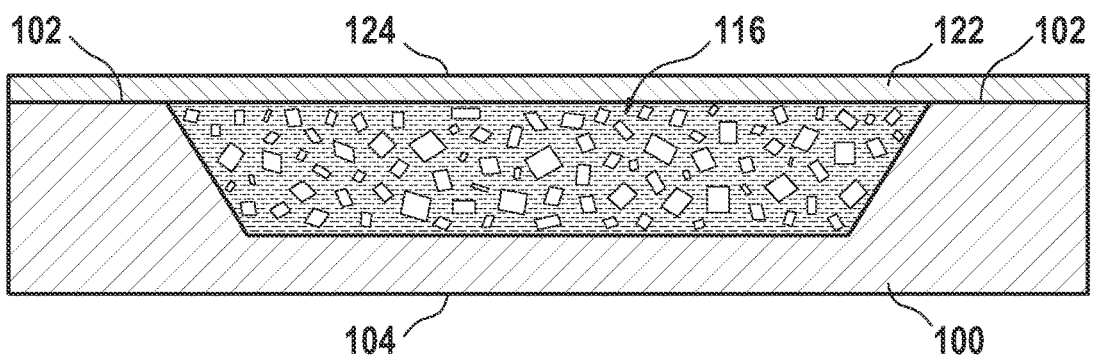

FIG. 4 shows the substrate 100 after a cover layer 122 has been applied onto the surface 102 of the substrate 100. The cover layer 122 can, for example, be a so-called prepreg. As an alternative, the cover layer 122 can, for example, be a plastic layer which is laminated onto the surface 102.

The cover layer 122 bridges the open end 108 of the cavity 106 and smoothes out any potential unevenness in the transition region between the surface 102 and the surface of the paste at the open end 108 so that a flat surface 124 results which completely overs the surface 102.

Figure 5:
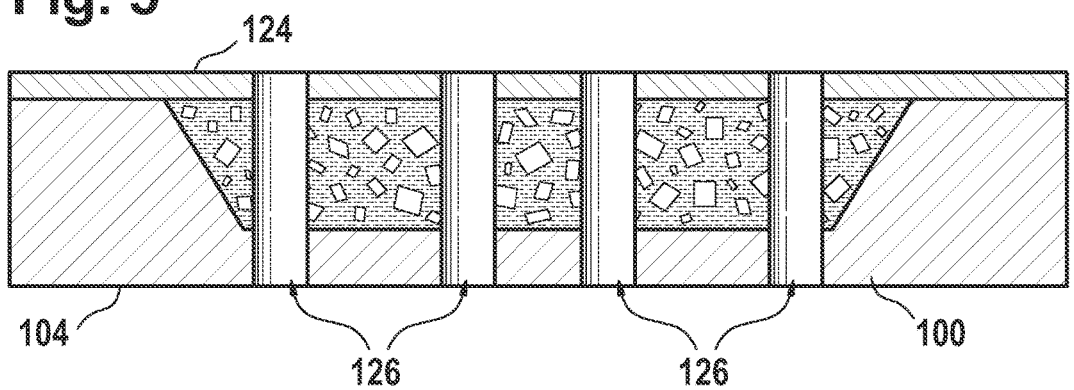
Figure 6:
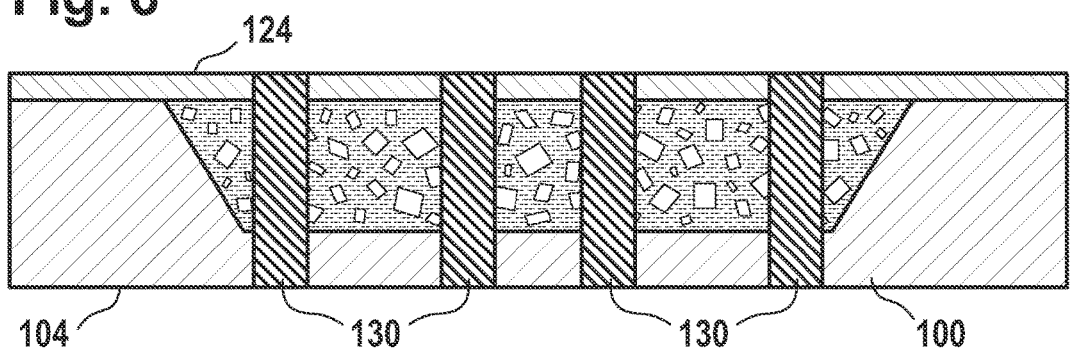

FIG. 5 shows the substrate 100 after through-holes 126 have been drilled through the substrate 100 so as to create so-called VIAs, said through-holes 126 extending through the cavity 106 and the paste that is present therein. The through-holes can be drilled by means of a laser or using a mechanical technique.

The through-holes 126 extend from the surface 124 to the surface 104 and are vertical both with respect to the surface 124 and with respect to the surface 104.

If the material formed by the paste in the cavity 106, i.e., the core material 116, is electrically conductive, the following steps are taken to apply an insulating layer 128 (see FIG. 7) prior to plating the through-holes 126 (see FIG. 8): The through-holes 126 are filled with an electrically insulating material 130. The material 130 can, for example, be a resin.

Figure 7:
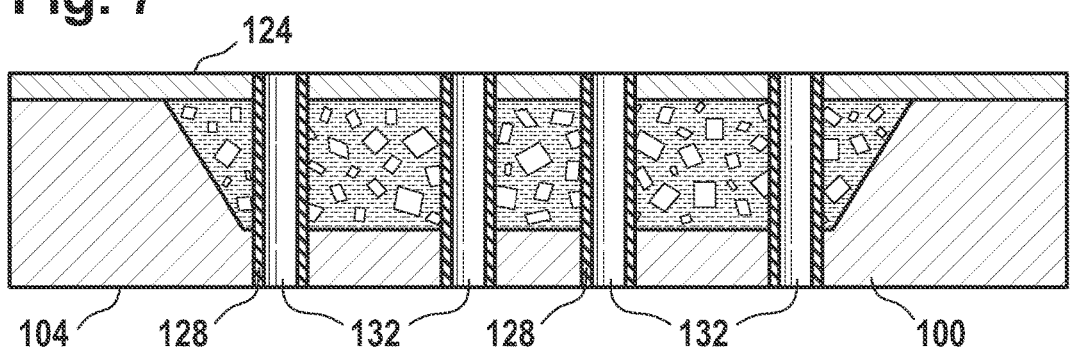
Figure 8:
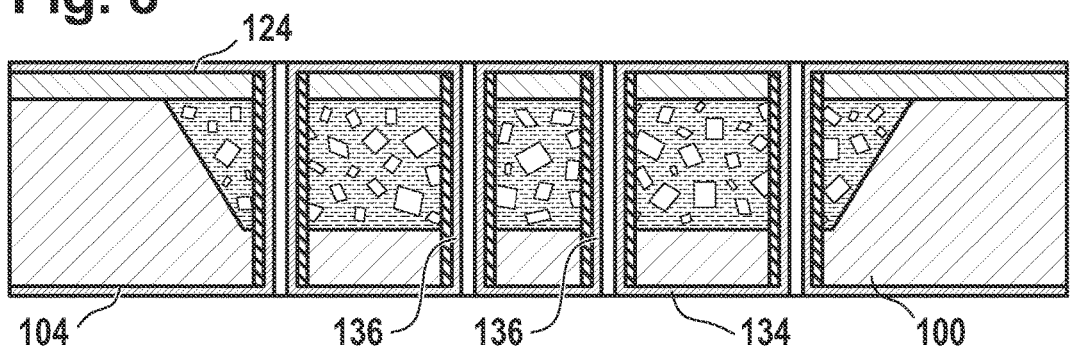
Figure 9:
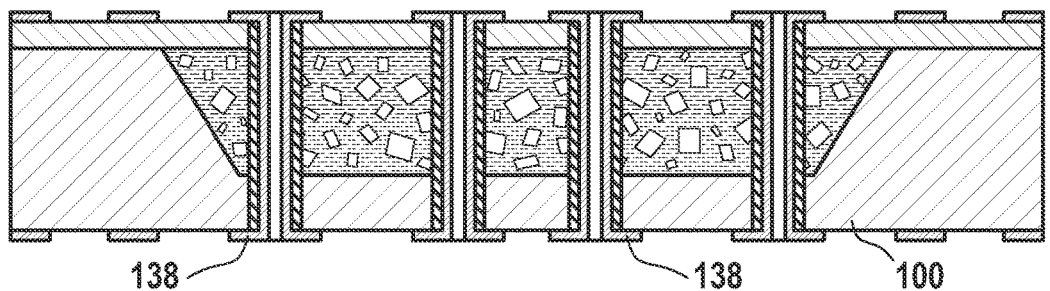

Subsequently, through-holes 132 are drilled through the through-holes 126 and the insulating material 130, as shown in FIG. 7. The drill diameter used is smaller than that used for the through-holes 126, so that the insulating layer 128 of the insulating material 130 remains on the inside wall of the through-holes 126.

Subsequently, the substrate 100 is plated, for example, in a copper bath, so that a layer 134 of a conductive material, for example, copper, is precipitated on the insulating layer 128, the surface 124 and the surface 104. In this manner, the through-holes 132 are plated so that the first winding portions 136 of the coil to be produced are obtained.

In this particular embodiment, the second winding portions 138 are created by structuring the layer 134, for example, by means of an etching technique. The winding portions 138 establish an electric contact with the winding portions 136 so that in this particular embodiment, a circular or oval ring-type coil 140 is obtained, as the top view in FIGS. 12 and 13 shows.

Figure 2:
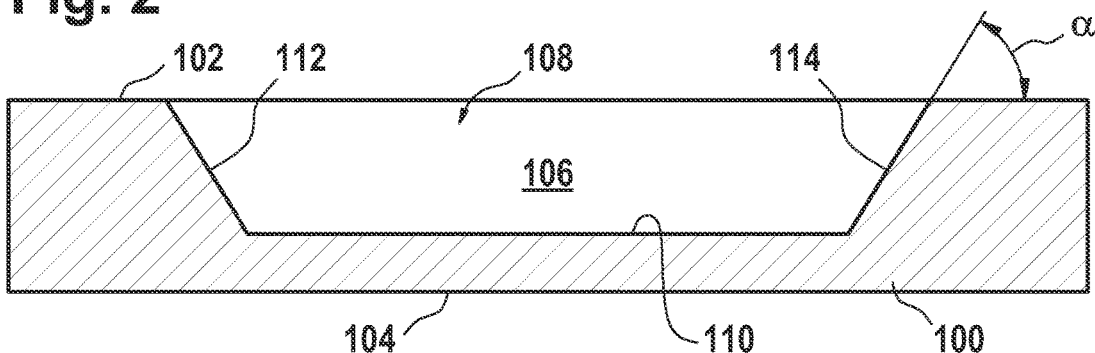

As an alternative to FIG. 2, FIG. 10 shows a rectangular layout of the cross section of the cavity 106, and FIG. 11 shows another layout of a cavity 106 with a semicircular profile. Depending on the specific application, the cavity 106 can also have other geometric shapes.

FIG. 12 shows a top view of the surface 122 with the winding portions 138 which extend in this plane and which electrically connect two of the winding portions 136.

In this case, the first and the last winding portions 136 of the coil 140 are connected via conductor tracks 142 and 144 with contact surfaces 143 and 145, respectively.

The diameter of the coil 140 can be smaller than 5 mm, for example, 3.5 mm.

FIG. 13 shows a coil 140 having an oval shape.

FIG. 14 shows a circuit board 146 comprising two layers that are formed by substrates 100 and 100'. In the substrate 100, a first coil, and in the substrate 100', a second coil is integrated, for example, in conformity with the embodiment in FIG. 12 or 13. The two substrates 100 and 100' are connected to each other via a connecting layer 150 to form a structural unit. The first coil and the second coil are connected in series via a conductor track 152 so that the inductances of the first and the second coil add up.

FIGS. 15 and 16 shows an embodiment of the method disclosed by the present invention in which the paste that has been introduced into the cavity 106 is compacted. To this end, a separating film or foil 154 with a perforation 156 is applied onto the surface 102, thus covering the open ends 108 of the cavities 106.

The separating film or foil 154 is followed by a nonwoven material 158, and an additional separating film or foil 160 can optionally be applied onto the nonwoven material 158.

Subsequently, contact pressure is applied onto this structure which is then heated to a temperature of, for example, 70° C. to 80° C. This can be done in a vacuum.

As a result of the pressure and/or the temperature, the liquid portion of the paste is reduced, as a result of which the particles 118 are compacted. For example, solvent 162 present in the paste evaporates and passes through the perforation 156. It is subsequently absorbed by the nonwoven material 158, as shown in FIG. 16.

Subsequently, the separating films or foils 154 and, where appropriate, 160 as well as the nonwoven material 158 can be removed, and thereafter the cover layer 122 (see FIG. 4) is applied. Prior to applying the cover layer 122, the cavities 106 can optionally be filled with paste so as to fill the volume that was vacated as a result of the compaction.

As an alternative or in addition thereto, during the drying cycle, the paste can be set into vibration, e.g., by means of a vibrating table or an ultrasound transmitter, in order to produce convection in the paste and thus to counteract the formation of a plug at the open end 108 during the drying cycle.

FIG. 17 shows a two-layer PCB with an upper substrate 100 and a lower substrate 100'. A cavity 106 is, for example, milled into the upper substrate 100, said cavity serving to receive a core material 116 which serves to form the coil core, for example, a paste 116. The paste can, for example, be introduced into the cavity 106 using one or a plurality of printing techniques. As an alternative, the material used can be a film or foil or a film or foil structure which is introduced into the cavity 106. As an alternative or in addition thereto, the lower substrate 100' can also have a cavity, in which case the cavities of the upper substrate 100 and of the lower substrate 100' form a resulting cavity for receiving the core material 116.

According to another embodiment of the invention, the cavity 106 can also be a cut-out through the substrate 100. This is schematically shown in FIG. 20. In this embodiment, the winding portions 138 are not applied onto the upper face of the substrate 100, but on the upper face 168 of the core material 116 that has been introduced into the cavity 106.

The aforementioned embodiments make it possible to produce a coil, the coil axis of which runs parallel to the surface of the substrate 100, as shown in FIG. 17.

As shown in FIG. 17, the winding portions 136 shown as an example extend through the core material 116, i.e., for example, through the paste 116, thus ensuring that, as the winding portions 136 pass through cavity 106, they are surrounded on all sides by core material 116, and are not lying only on one side of the core material 116, as in the case of a standard coil.

This has the special surprising advantage that the stray field generated by the resulting coil in the outer region is reduced since the core material 116 concentrates the lines of force along the longitudinal axis of the coil in the direction of the inside of the coil, as shown in FIG. 18. The result is that the resulting magnetic field in the outer region of the coil is concentrated on the two end faces where the pattern of the lines of force becomes more homogeneous, which is useful especially for sensor applications.

According to another embodiment of the present invention, core material 116 can be applied, for example, by gluing a piece of film or foil, to one of the end faces of the coil 140, for example to end face 164, for the purpose of further optimizing the pattern of the lines of force on the end face.

FIG. 19 shows another embodiment of the present invention in which a coil 140 is applied onto a surface 102 of a substrate 100. To this end, winding portions 138 are first applied onto the surface 102. Subsequently the core material 116 is applied onto the surface 102, for example, in the form of a paste, said paste covering the winding portions 138 that had been applied onto the surface 102, except for a terminal contact.

After curing the paste, holes are drilled into the core material 116, into which holes the winding portions 136 of the coil are introduced, for example, by plating the drill holes.

Finally, additional winding portions 138 are applied onto the surface 166 of the core material 116 in order to form coil windings.

According to embodiments of the present invention, it is thus possible to form a coil according to the preceding embodiments, e.g., according to FIG. 12, 13 or 17, except that the coil is not integrated in a cavity of the substrate but is disposed on the surface of the substrate.

LIST OF REFERENCE CHARACTERS 100, 100' Substrate
102 Surface
104 Surface
106 Cavity
108 Open end
110 Bottom surface
112 Flank
114 Flank
116 Core material
118 Particles
120 Liquid
122 Cover layer
124 Surface
126 Through-holes
128 Insulating layer
130 Insulating material
132 Through-holes
134 Layer
136 Winding portion
138 Winding portion
140 Coil
142 Conductor track
143 Contact surface
144 Conductor track
145 Contact surface
146 Printed circuit board
150 Connecting layer
152 Conductor track
154 Separating film or foil
156 Perforation
158 Nonwoven material
160 Separating foil
162 Solvent
164 End face
166 Surface
168 Surface

The invention claimed is:

1. A method of producing a coil integrated in a substrate or applied onto a substrate, using the following steps:
   introducing a core material into a cavity of the substrate or applying the core material onto the substrate;
   introducing first winding portions of the coil into the core material, which pass through the core material, wherein the first winding portions are embedded in the core material such that each first winding portion passes through an individual through-hole through the core material and is surrounded on its sides by the core material as it passes through the core material;
   applying second winding portions of the coil, with the second winding portions contacting the first winding portions so as to create the windings of the coil.

2. The method as in claim 1, wherein the cavity is produced in the substrate, said cavity having at least one open end which interrupts a surface of the substrate, with the first winding portions being vertical with respect to the surface, with several or all of the first winding portions passing through the cavity, with the second winding portions of the coil being applied onto the surfaces of the substrate, with the second winding portions contacting the first winding portions so as to create the windings of the coil, with the cavity being, for example, a cut-out through the substrate or a recess in the substrate.

3. The method as in claim 2, further comprising the step of closing the cavity by applying a cover layer so as to bridge the interruption of the surface of the substrate, with the second winding portions being applied onto the cover layer.

4. The method as in claim 2, wherein the cavity comprises a bottom surface parallel to the surface of the substrate and lateral flanks, with the lateral flanks forming a right or an acute angle α with the surface of the substrate interrupted by the at least one open end.

5. The method as in claim 4, wherein the acute angle α between the bottom surface and the lateral flanks of the cavity measures between 30° and 60°, preferably 45°, so that the cross-sectional surface area of the cavity increases from the bottom surface to the surface of the substrate interrupted by the at least one open end.

6. The method as in claim 1, wherein the core material is introduced in to the cavity in the form of a paste, a film or foil or a solid.

7. The method as in claim 6, wherein the solid is affixed in the cavity so as to be keyed and/or friction-locked.

8. The method as in claim 6, wherein the paste is introduced into the cavity using a printing method or by means of a dispenser.

9. The method as in claim 6, wherein the cavity comprises lateral flanks, each of which forms an angle α from 40° to 50°, preferably 45°, with the surface of the substrate interrupted by the at least one open end, and wherein the paste is introduced into the cavity by means of screen printing.

10. The method as in claim 6, wherein the first winding portions are introduced into the substrate in the form of vias, with several or all of the vias passing through the cavity and the core material contained in the cavity.

11. The method as in claim 10, wherein the core material formed by the paste in the cavity is electrically conductive, and wherein one of the vias is introduced into the substrate using the following steps:
   drilling a first through-hole through the substrate, with the first through-hole passing through the core material;

filling the through-hole with an electrically insulating material;

drilling a second through-hole through the electrically insulating material contained in the first through-hole so that a layer of the electrically insulating material remains on the surface of the first through-hole; and applying electrically conductive material to the remaining layer.

12. The method as in claim 6, wherein, after introduction of the paste, the particles are compacted by applying pressure to the paste and/or by increasing a temperature, which reduces the liquid portion of the paste.

13. The method as in claim 12, wherein a volume vacated in the cavity as a result of the compaction is filled by again introducing the paste into the cavity.

14. The method as in claim 12, wherein the following steps are carried out to compact the particles:

applying a separating layer, said separating layer being permeable for the liquid portion of the paste, in particular if said liquid portion is in the gaseous phase, applying a receiving layer onto the separating layer, said receiving layer being designed to receive the liquid portion of the paste that passes through the separating layer, removing the separating layer and the receiving layer, wherein the cavity is closed by a cover layer after the separating layer and the receiving layer have been removed.

15. The method as in claim 6, wherein the cavity is completely filled with the paste.

16. The method as in claim 6, wherein the paste is mixed, in particular by means of vibration or by exposure to ultrasound, in the course of a process of drying the paste in order to cure the paste.

17. The method as in claim 1, wherein the second winding portions of the coil are applied onto a surface of the core material, with the surface of the core material being at a certain distance from a surface of the substrate from which the core material projects.

18. The method as in claim 1, wherein the substrate is a circuit board material of an electronic circuit board, in particular a fiber-reinforced synthetic or a synthetic film or foil.

19. The method as in claim 1, wherein the cavity is created by removing material from the substrate, in particular by removing the material of the substrate by means of a laser or by a machining technique, in particular by milling.

20. The method as in claim 1, wherein the cavity has a ring-type, toroidal, rectangular, multi-cornered, convex, curved or disk-type shape.

21. The method as in claim 1, wherein the core material comprises ferromagnetic particles, in particular particles formed from a soft magnetic amorphous and/or nanocrystalline alloy, and/or a ferrite.

22. The method as in claim 1, wherein the second winding portions are applied by means of a structuring technique, in particular by means of etching, or by means of a printing technique.

23. The method as in claim 1, wherein a plurality of integrated coils are produced in the substrate and the coils are connected to form a sensor array.

* * * * *